United States Patent [19]
Simmons et al.

[11] Patent Number: 6,110,393
[45] Date of Patent: Aug. 29, 2000

[54] EPOXY BOND AND STOP ETCH FABRICATION METHOD

[75] Inventors: Jerry A. Simmons, Sandia Park, N. Mex.; Mark V. Weckwerth, Pleasanton, Calif.; Wes E. Baca, Albuquerque, N. Mex.

[73] Assignee: Sandia Corporation, Albuquerque, N. Mex.

[21] Appl. No.: 09/066,091

[22] Filed: Apr. 23, 1998

Related U.S. Application Data

[63] Continuation-in-part of application No. 08/728,003, Oct. 9, 1996, Pat. No. 5,825,049.

[51] Int. Cl.$^7$ .............................. B44C 1/22; H01L 21/461
[52] U.S. Cl. .................................. 216/36; 216/33; 216/52; 438/751; 438/753; 204/192.35
[58] Field of Search ................... 216/33, 36, 52; 438/751, 753; 204/192.35

[56] References Cited

U.S. PATENT DOCUMENTS

| | | | |
|---|---|---|---|
| 2,747,977 | 5/1956 | Eisler | 216/36 |
| 5,116,459 | 5/1992 | Kordus et al. | 156/631 |

*Primary Examiner*—Elizabeth Wood
*Attorney, Agent, or Firm*—Brian W. Dodson

[57] ABSTRACT

A class of epoxy bond and stop etch (EBASE) microelectronic fabrication techniques is disclosed. The essence of such techniques is to grow circuit components on top of a stop etch layer grown on a first substrate. The first substrate and a host substrate are then bonded together so that the circuit components are attached to the host substrate by the bonding agent. The first substrate is then removed, e.g., by a chemical or physical etching process to which the stop etch layer is resistant. EBASE fabrication methods allow access to regions of a device structure which are usually blocked by the presence of a substrate, and are of particular utility in the fabrication of ultrafast electronic and optoelectronic devices and circuits.

35 Claims, 6 Drawing Sheets

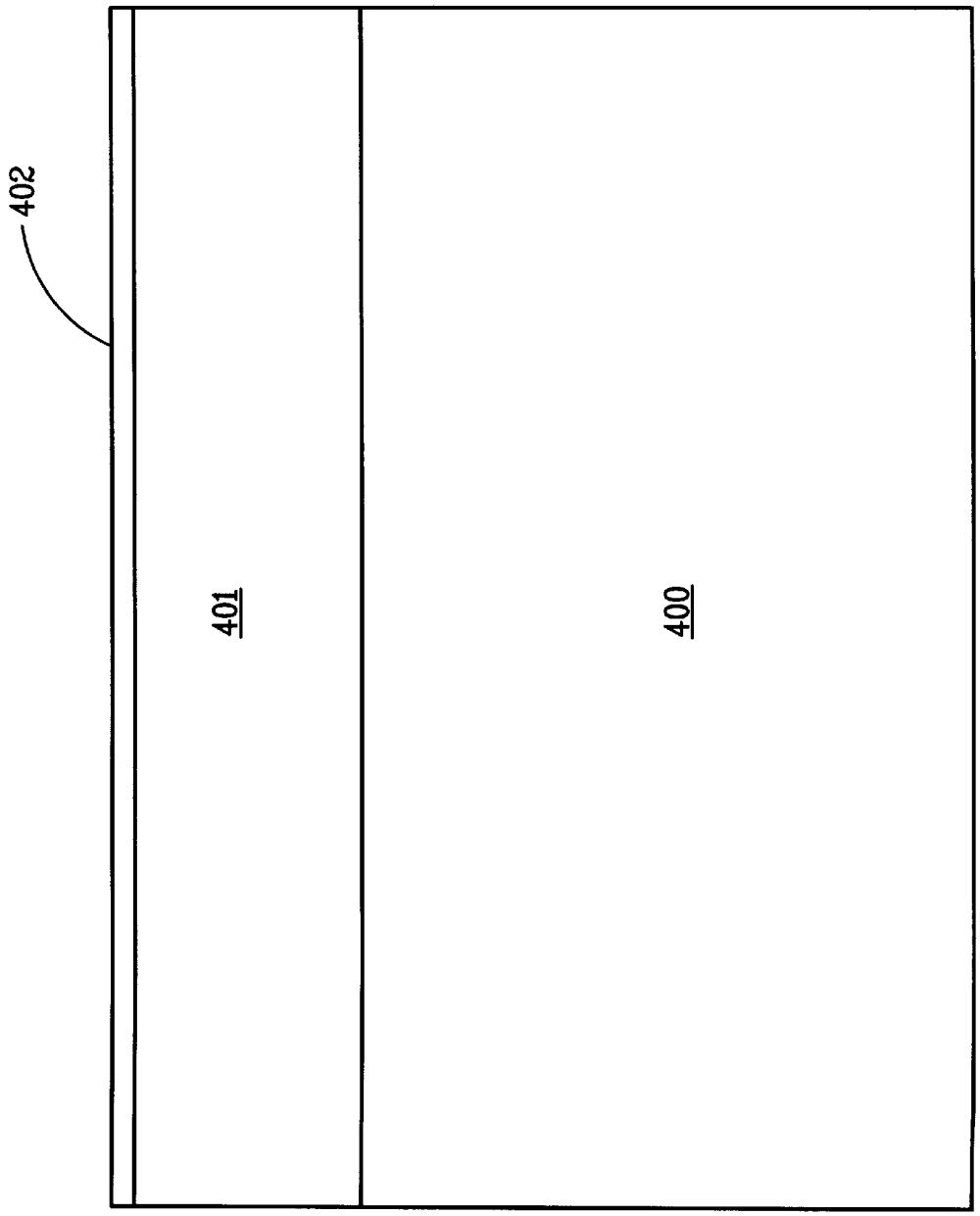

EPOXY BOND AND STOP ETCH FABRICATION METHOD

This application is a continuation-in-part of U.S. patent application Ser. No. 08/728,003 (Simmons et al), filed Oct. 9, 1996, now U.S. Pat. No. 5,825,049.

GOVERNMENT RIGHTS

This invention was made with United States Government Support under Dept. of Energy Contract No. DE-AC04-94AL85000. The Government has certain rights in this invention.

BACKGROUND OF THE INVENTION

The present invention relates generally to the fabrication of semiconductor devices and nanoscale structures. More specifically, the present invention relates to a fabrication process which enables the fabrication of nanometer-scale structures having localized features difficult to create using conventional fabrication techniques.

The thrust of semiconductor fabrication over the past 40 years has been to smaller and more densely integrated devices. New manufacturing facilities currently are based on a feature size of 250 nanometers (250 nm), and the next generation will use a feature size approaching 180 nm. More recently, the challenge of fabricating practical quantum transport devices has driven development of special techniques, such a e-beam lithography, which can be used to routinely create device structures having features as small as 10 nm.

Semiconductor devices and quantum transport devices generally comprise a number of discrete material layers. These layers can be made from metals, insulators, or various types of semiconductors. They are often doped with impurities to tailor their electronic properties, and may be fabricated with a built-in strain to alter the bulk band structure. The thickness of these layers is usually significantly less than the minimum feature size.

A major force driving the development of smaller devices, and in particular of quantum transport devices, is the need for devices with faster response times. Devices with intrinsic response times in the sub-picosecond range can be designed based on resonant tunneling effects. Tunneling is an inherently fast physical process. In addition, devices based upon resonant tunneling often exhibit negative differential resistance. This property can be used to make oscillators and switching elements—in fact, most analog and digital circuitry, as well as optoelectronics, can be designed around such devices, resulting in a complete quantum electronics with peak operating frequencies in the millimeter to far-IR range.

Even if such devices are available, however, many potential difficulties appear in incorporation into practical applications. One example is that the parasitic capacitance and inductance associated with interconnects between devices and with electrical contacts to devices can limit the practical operating speed of a circuit comprising extremely fast devices. One such design restriction is that a conductor having a large cross-section is required to move electrons quickly from one point to another, e.g., to inform a second device that a first device has changed state. As suggested above, however, contacts and conductors with large cross-sections are often incompatible with the extremely thin material layers which typically appear in the desired device structures.

In the prior art, this dissonance causes a tradeoff between the desire to have speedy devices and the desire to allow speedy communication between devices, resulting in a compromise situation where the devices are slower than they might be in order to enable sufficiently fast interconnects to be made.

The above is just one example of a class of tradeoffs in microelectronic circuit design which are driven by the inability to reliably deposit continuous thin layers over localized thick obstacles. There is a long-acknowledged need for practical design and fabrication techniques to avoid such tradeoffs.

It is possible in principle to redesign suitable devices to combine a stack of flat thin layers with contacts and control structures having large cross-sections, simply by placing the contacts and control structures external to the sandwich of layers making up the basic device structure. To produce such designs with conventional fabrication methods, however, requires creation of large-scale buried localized structures. Such structures are difficult to replanarize prior to deposition of the thin device layers using conventional microelectronic fabrication techniques. There is thus a need for a new class of microelectronic fabrication techniques which allows the use of large-scale buried localized structures.

The present invention addresses the above need by allowing large-scale structures to be grown on a stop etch layer atop a substrate, followed by burying the features in an epoxy bond deployed between the device layers and a host substrate. The original substrate is then etched away, leaving a new free surface on the opposite side of the device layers on which large-scale contacts and the like can be grown. The present invention thus successfully combines large-scale (and hence fast) contacts and interconnects with flat thin device layers, thereby leading to faster overall circuit operation.

SUMMARY OF THE INVENTION

The present invention pertains to a new class of epoxy bond and stop etch (EBASE) methods for fabrication of microelectronic devices and circuits. The essence of such methods is to grow a stop etch layer on a sacrificial substrate and fabricate portions of an electronic device or circuit on top of the stop etch layer. One then bonds the sacrificial substrate to a host substrate so that the bonding agent is disposed between the device portions fabricated atop the stop etch layer and the host substrate. The sacrificial substrate is then removed, typically using a chemical etchant to which the stop etch layer is resistant. This exposes the rear of the device portions, which are usually blocked from direct application of fabrication techniques by the presence of the sacrificial substrate. Further processing and connection of the devices to circuitry on the host substrate usually completes the fabrication process. Use of EBASE fabrication methods can reduce the number of fabrication steps needed to functionally contact complex devices and can relieve problems related to, e.g., layer planarization.

BRIEF DESCRIPTION OF THE DRAWINGS

FIG. 3 shows a series of intermediate structures appearing in the EBASE fabrication of a DELTT device.

FIG. 4 shows a multi-layer stop etch layer.

DETAILED DESCRIPTION

Figure 1:
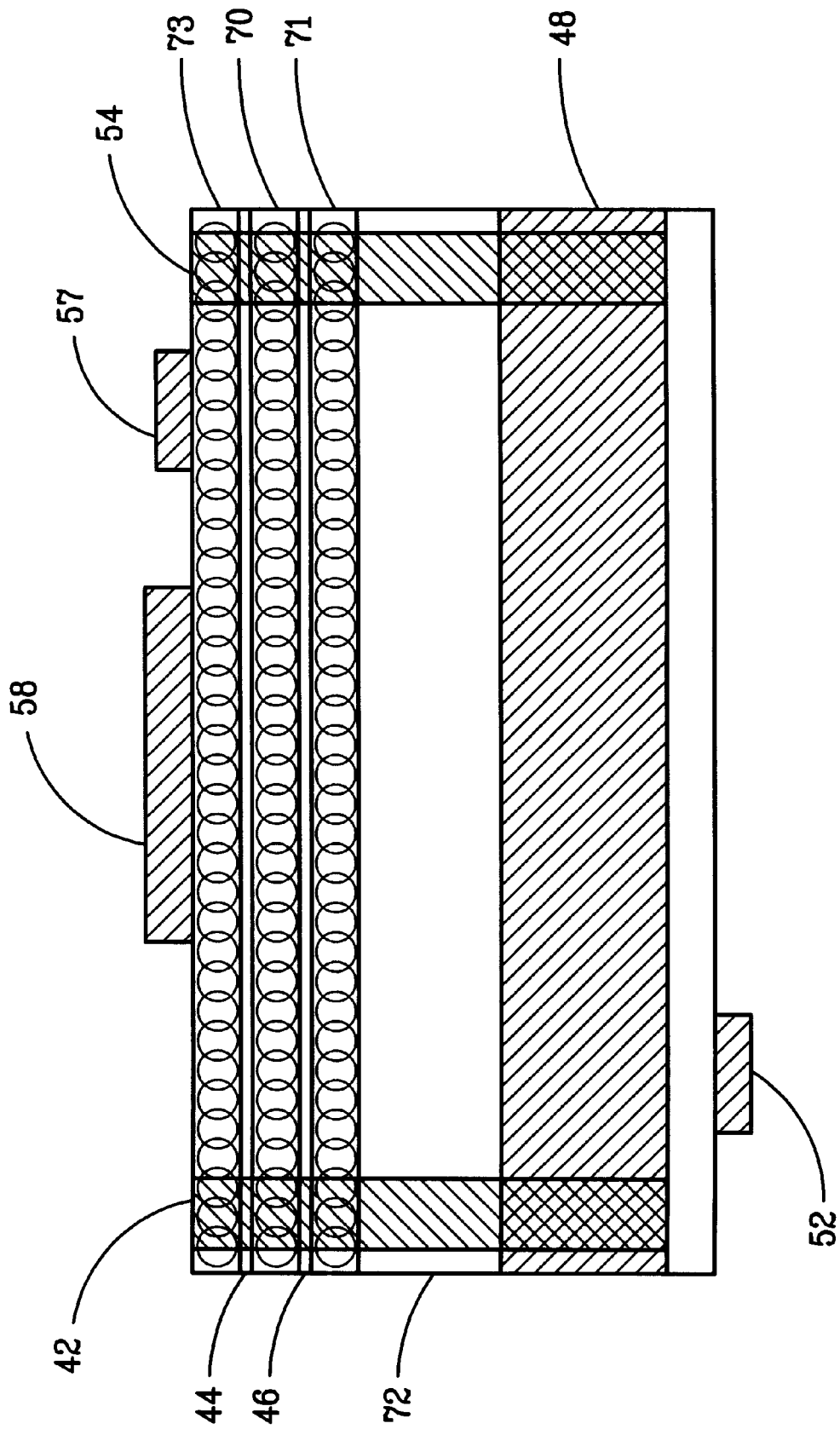
FIG. 1 shows a schematic illustration of a DELTT device.

The present invention comprises a class of microelectronic fabrication techniques which we collectively call epoxy bond and stop etch (EBASE) methods. The essence of such techniques is to fabricate or partially fabricate a device structure on top of a stop etch layer on a substrate. (The device structure can comprise partially defined devices, completed devices, or subcircuits.) After the device structure is prepared, the top surface of the device structure is bonded to a host substrate (typically using an adhesive). The original substrate is then etched away, leaving a sandwich containing the stop etch layer and the device structure, bonded to the host substrate. This sandwich is termed an EBASE wafer for convenience. Additional fabrication steps can then be carried out on the EBASE wafer to complete the device and functionally connect it to a circuit.

The EBASE fabrication method can be implemented in many variants. The substrate can be any material compatible with the formation of the desired device structure. Although the discussion below will concentrate on single crystal semiconductor substrates, this limitation is not fundamental. For example, amorphous silicon solar cells can be fabricated on either a metal or a glass substrate. The EBASE technique can be used to provide access to the rear electrodes of such devices, and to allow them to be integrated into other chips. Similarly, many electronic devices must be fabricated from several layers of different semiconductor materials possessing a common epitaxial relationship. Although such devices are compatible with EBASE fabrication methods, such methods do not require epitaxial structures.

In the discussion the removal of the sacrificial substrate is usually described in terms of etching. Although chemical etching is indeed one approach to such removal, other approaches are possible, as well as combinations of several approaches. By chemical etching we mean the use of a chemical etchant which will dissolve the sacrificial substrate. Other approaches to remove the sacrificial substrate include mechanical abrasion, chemical polishing, and dry etching techniques such as sputtering, plasma etching, chemical vapor etching, and other processes known in the art. Very often combinations of these techniques can be useful, e.g., using mechanical abrasion to remove most of the sacrificial substrate, followed by chemical etching to remove the remainder. The mechanical abrasion is faster, but the chemical etching will stop at the stop etch layer.

A stop etch layer is usually construed to be a layer of material which is resistant to the action of some chemical etchant which readily dissolves the material from which the substrate is made. As other approaches to remove the sacrificial substrate are compatible with EBASE fabrication, additional approaches to defining a stop etch layer must be considered. For example, if mechanical abrasion is used to remove a porous glass substrate, the stop etch layer might be a dense layer of diamond-like carbon. If dry etching techniques are used to remove a silicon substrate, thermally-grown silicon oxide, silicon nitride, or (in some cases) even a polycrystalline silicon layer can act as the stop etch layer.

Note that a stop etch layer need not have different chemical composition from the sacrificial substrate. Consider a sacrificial substrate made of porous glass having a very small pore size and a large specific area (specific area=surface area/mass). Form thereon a stop etch layer of the same glass, but now essentially without pores. The specific area of the porous glass will typically be 3–5 orders of magnitude larger than that of the dense stop etch layer. If a chemical etchant is used to remove the sacrificial substrate, the much greater surface area available on the sacrificial substrate will result in the porous glass substrate being removed at rates many orders of magnitude larger than the dense stop etch glass layer. Hence, a sub-micron stop etch layer of dense material can be sufficient protection for a porous substrate of that same material having a thickness of as much as several millimeters.

The EBASE methods involve bonding the device structure to a host substrate. This is done partially to provide a handle for manipulation and processing of the device structure once the rear of the structure is exposed by removal of the sacrificial substrate, partially to allow the device structure to be integrated into circuitry implemented in or on the host substrate, and partially to protect the device structure, when necessary, from the influence of the process used to remove the sacrificial substrate.

When the process to remove the sacrificial substrate comprises use of a chemical etchant, it is often necessary to provide a hermetic seal over the device structure so that the device structure is protected from attack from the etchant. Generally the bonding agent is chosen to serve this role. However, a separate treatment can be used to add a protecting layer over the device structure prior to bonding. Such a configuration is included in the scope of the present invention.

Adhesives, specifically epoxies, are most often used as the bonding agents. However, our experience shows that the use of most epoxies and adhesives leads to low product yield, presumably owing to induction of failure modes which are as yet not completely understood. We have had particular success with an epoxy, developed for mounting scanning microscope samples called Gatan G-1. This epoxy, supplied by Gatan, Inc. of Pleasanton, Calif., allows the EBASE technique to be used with a satisfactory failure rate for most applications.

Other agents, such as indium-based solder, can be used as bonding agents when they are compatible with the materials involved and the specific EBASE method to be used. Such use must be evaluated on a case-by-case basis.

Once the sacrificial substrate has been removed, the device structure must be made functional. In some cases, this requires no further steps, e.g., when the device structure forms a complete passive microwave transponder, powered by incident microwave energy and producing a responding fingerprinted microwave signal. Such a circuit could be fabricated entirely on an EBASE wafer attached to, e.g., an object in a secure facility.

Another situation is when functional connection with an operating circuit partially residing on the host substrate can be implemented as part of the bonding process. There are at least two such situations. First is when the "connection" between the device structure on the EBASE wafer and the circuit elements on the host substrate is made by capacitive, inductive, or electromagnetic coupling. In such instances, the "connection" is accomplished through proximity, and requires no physical contact for function. The other possibility is when use of a conducting epoxy on regions of the EBASE wafer as part of the bonding step allows functional contact with the operating circuit to be made.

More commonly, however, additional processing steps will be required after the EBASE wafer is bonded to the host substrate and the sacrificial substrate is removed to produce a functional circuit. Additional steps may be required to complete fabrication of functioning devices on the EBASE wafer, which can be carried out using standard semiconductor fabrication techniques, as long as the techniques are compatible with the materials involved.

In addition, additional steps may be required to functionally connect devices on the EBASE wafer to the remainder of the operating circuit residing on the host substrate. Such steps may include any of the usual procedures known in microelectronic lithography (plated vias, diffused contacts, implanted contacts, deposited metal conductors, etc.), so long as the process conditions are compatible with the materials of the host substrate, the EBASE wafer, and the bonding agent. (For example, most bonding agents will not withstand the temperatures required to anneal an ion-implanted buried contact in silicon or gallium arsenide.) Other processes, such as those used in fabrication of thick-film circuits, and actual wiring techniques such as thermocompression bonding, can be used if the materials are compatible and the EBASE wafer and host substrate are sufficiently robust.

In the background section the need to combine large-scale conductors with thin device layers was established as a use for EBASE methods. Another application is the integration of devices into a circuit where the devices and the circuit are made from incompatible materials. For example, it is difficult if not impossible to grow device-quality GaAs material on a silicon substrate, rendering integration of GaAs devices into a silicon integrated circuit a difficult proposition. (Such combinations are of interest, e.g., for integration of GaAs-based optoelectronic devices with VLSI silicon-based processors—a possible basis for future optical computers.) The EBASE technique can be used to integrate GaAs devices or subcircuits onto a silicon integrated circuit so that electrical interconnects between the two pieces of circuitry can be easily made. Further applications include combining power devices and small-signal circuitry into a single integrated package without requiring the use of overly complicated fabrication schemes.

A related prior art method, called lift-off technology, appears to provide many of the useful features of the present EBASE methods. In lift-off technology, rather than growing the device structure on a stop etch layer atop a substrate, it is grown on a sacrificial layer atop a substrate. The sacrificial layer is chosen so that it dissolves very rapidly in a chemical etchant compared to the substrate material. The device structure, which is now attached by epoxy to a host substrate, is released from the original substrate by the dissolution of the sacrificial layer.

There are major differences between lift-off methods and the present EBASE methods. The most obvious is that EBASE methods require that the entire substrate be etched away, whereas in the lift-off methods only the thin sacrificial layer is etched away. A major problem with the lift-off methods is that the chemical etchant must penetrate a micron-scale gap for a distance on the order of millimeters in order to supply fresh etchant and to remove dissolved sacrificial layer. In addition, mechanical stress on the device structure in the late stages of etching, when the massive substrate is connected to the device structure at a few small points of contact, can damage the device structure by inducing mechanical deformation. The lift-off methods are also restricted to use of chemical etching techniques, whereas the EBASE methods can use a wide variety of material removal techniques. Finally, at some point in using the lift-off techniques it becomes necessary to handle and manipulate the extremely thin (several microns) freestanding layer of semiconductor after the substrate has been removed. This stage of the overall process is fraught with difficulty and opportunities for failure. By contrast the present invention never requires one to handle a thin freestanding layer.

A further use for the present invention is to improve heat sinking of electronic components. In general, the faster a component is the larger the power dissipation. Heat build up is thus a major problem in sub-nanosecond circuitry. Growth of a component or an integrated circuit on, e.g., a GaAs substrate requires that any heat generated must travel through the thickness of the substrate (perhaps several hundred microns) before the heat energy can be dissipated into a heat sink of extremely high thermal conductivity. However, using the EBASE methods any circuit can be bonded to a substrate with very high thermal conductivity (copper, silver, diamond, sapphire, etc.) so that the only thermal barrier is a submicron layer of bonding agent. If that bonding agent is further treated (e.g., by loading with metal powder) so as to have high thermal conductivity, the rate of heat removal from the operating high-frequency devices can be many times larger than is possible using heat transfer through conventional substrates.

To illustrate the of the present invention the fabrication of a quantum DELTT (Double Electron Layer Tunneling Transistor) device will be described. Discussion of application of EBASE methods to this specific structure is intended only to illustrate such use, and not to restrict the scope of the present invention thereby.

A double electron layer tunneling (DELTT) device as illustrated in FIG. 1 comprises an emitter contact 42 in electrical contact with a two-dimensional quantum well emitter layer 44. (Here two-dimensional means that the carriers essentially have momentum vectors restricted to a plane.) A two-dimensional quantum well resonant tunneling layer 46 is separated from emitter layer 44 by a first tunneling barrier 70, and from voltage drop layer 72 by a second tunneling barrier 71. Collector layer 48 is in contact with the voltage drop layer 72 and with collector contact 54. A control gate 58 is placed atop insulating layer 73 over emitter layer 44 to change the energies of the occupied electron states in the emitter layer, thereby controlling tunneling of electrons between the emitter layer and the resonant tunneling layer. Finally, electrical contact between the emitter layer and the collector contact, and between the collector and the emitter contact, is prevented through the action of depletion gate 57 and depletion backgate 52.

In a specific implementation, emitter layer 44, resonant tunneling layer 46, voltage drop layer 72, and collector 48 comprise gallium arsenide, and first tunneling barrier 70, second tunneling barrier 71, and insulating layer 73 comprise aluminum gallium arsenide. Emitter layer 44 has a thickness of about 15 nm, resonant tunneling layer 46 has a thickness of around 5 nm, and the first and second tunneling barriers 70 and 71 and insulating layer 73 all have thicknesses of about 7 nm.

Figure 2:
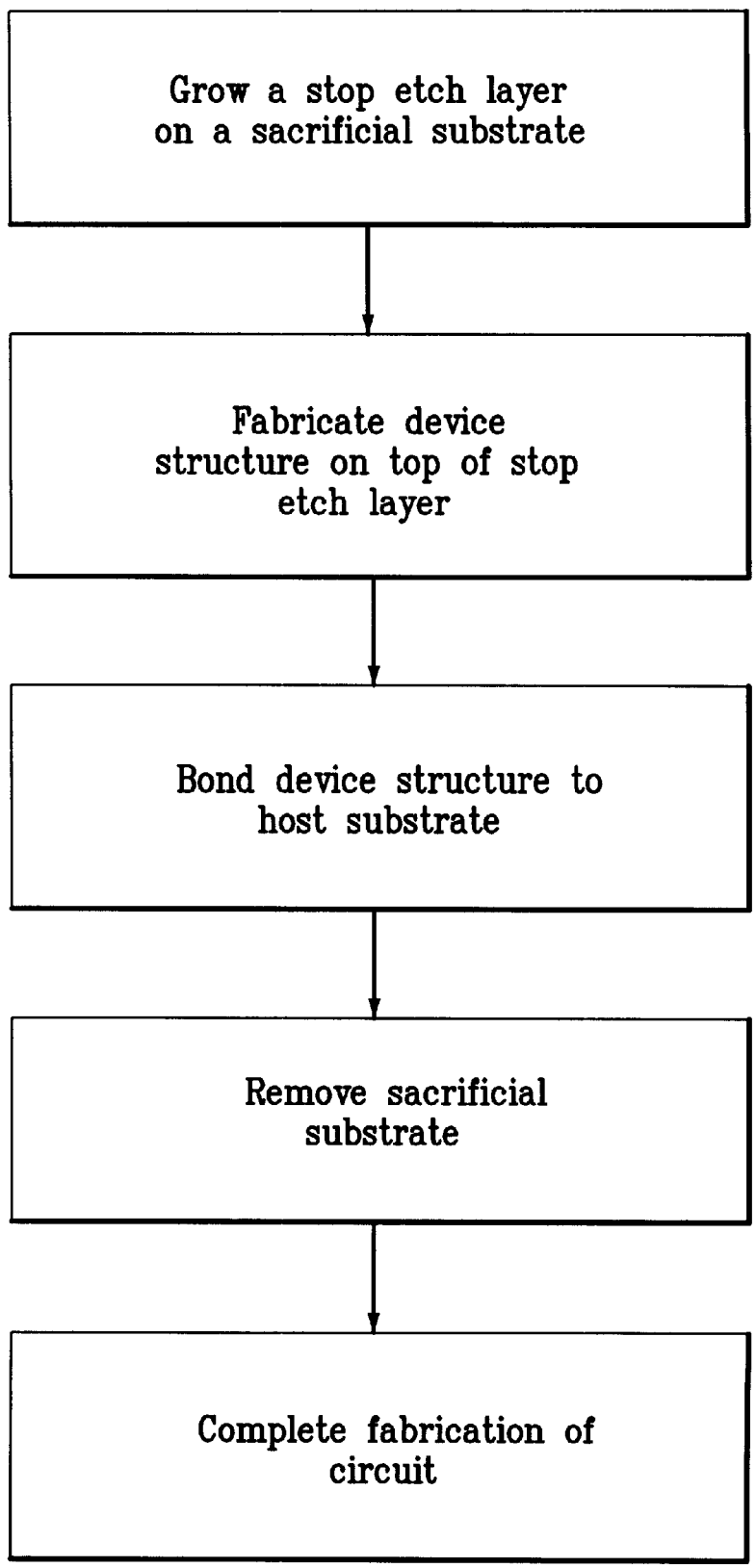
FIG. 2 shows a flow chart of a sample EBASE fabrication process.

Process steps for a general EBASE method for the fabrication of arbitrary devices or subcircuits appear in the flow diagram of FIG. 2.

In this application considerable attention is paid to the AlGaAs/GaAs semiconductor system, as it provides simple and well-known examples of fabrication techniques on which the EBASE methods can be based. However, discussion of this material system is not intended to limit the scope of the present invention thereto. Instead, any materials for which suitable stop-etch layers and etchant combinations are known are intended to be included in the scope of the present invention.

When the AlGaAs/GaAs system is used, the stop etch layer can be made of AlGaAs having an aluminum/gallium ratio of about 30/70 aluminum content or higher deposited in a layer several hundred nanometers thick on a GaAs sacrificial substrate. After the desired device layers are deposited on the stop etch layer, and are bonded to their permanent substrate, the GaAs sacrificial substrate is removed. Whereas this can be accomplished entirely using etching, more commonly a portion of the GaAs substrate is removed by lapping or sputtering, and the remainder removed using a relatively weak etchant such as citric acid in $H_2O_2$ in the ratio 6.5:1.

The epoxy-bond-and-stop-etch (EBASE) method can be applied to fabricating such a DELTT device with planar thin device layers, thereby avoiding the compromises described earlier. A particular set of process steps for the device of FIG. 1 comprising the materials discussed above would include, in order:

I. Grow an epitaxial AlGaAs stop etch layer with high aluminum content on a GaAs substrate;

II. Fabricate the material layers required for a DELTT device structure on the stop etch layer, by process steps comprising:
   a) grow an insulating buffer of epitaxial AlGaAs on the stop etch layer;
   b) grow an epitaxial GaAs collector layer on the insulating buffer layer;
   c) grow an epitaxial GaAs voltage drop layer on the GaAs collector layer;
   d) grow an epitaxial AlGaAs first tunneling barrier on the voltage drop layer;
   e) grow an epitaxial GaAs two-dimensional quantum well resonant tunneling layer on the first tunneling barrier;
   f) grow an epitaxial AlGaAs second tunneling barrier on the resonant tunneling layer;
   g) grow an epitaxial GaAs two-dimensional quantum well emitter layer on the second tunneling barrier; and
   h) grow an epitaxial AlGaAs insulating layer on the emitter layer;

III. Form an emitter contact which electrically contacts the emitter layer;

IV. Form a collector contact which electrically contacts the collector layer;

V. Deposit a metal control gate on the insulating layer above the functional portion of the DELTT;

VI. Deposit a metal depletion top gate on the insulating layer;

VII. Bond the free surface of the DELTT layers to a host substrate with a bonding agent;

VIII. Etch away the GaAs substrate to the stop etch layer;

IX. Electrically contact buried structures by etching vias and coating them with metal; and X. Deposit a metal depletion backgate on the stop etch layer.

Well-known techniques exist to carry out most of the process steps listed above. For example, the collector contact can be formed by alloying, by ion implantation followed by anneal, by via formation followed by metal plating, and by other methods known to one skilled in the art. The essence of the EBASE method is the combination of forming the stop etch layer, forming the desired device structure (or as much as one intends to fabricate while the substrate blocks access to the rear of the structure), bonding the front of the device structure to a host substrate, etching away the original substrate, and then completing whatever fabrication steps remain. As demonstrated above, the resulting structure (in this case a DELTT device) is constructed so that its thinnest layers remain smooth and flat.

Figure 3A:
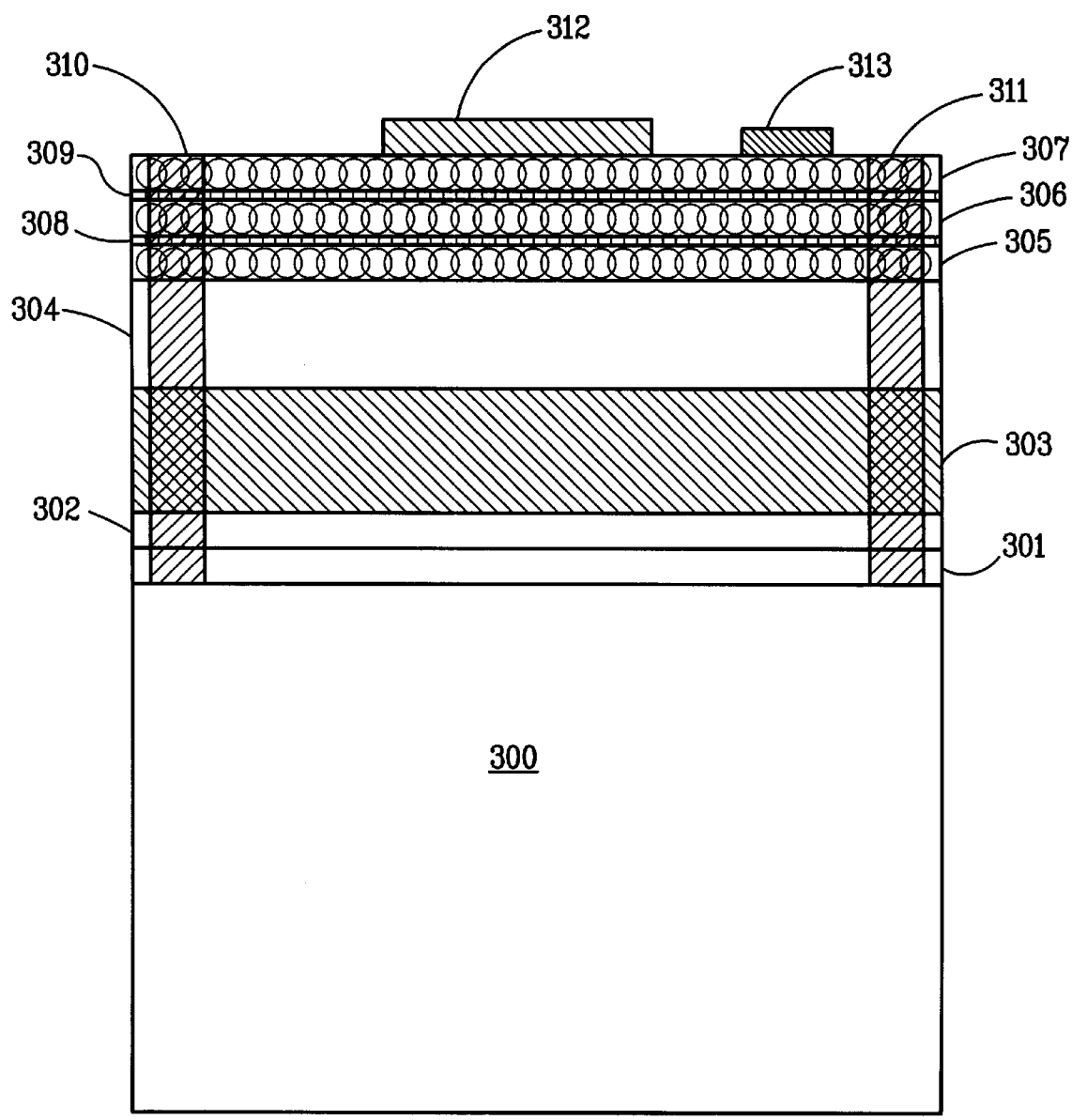
FIG. 3a shows the basic DELTT structure grown on top of a stop etch layer on a sacrificial substrate.

FIG. 3 shows a sequence of intermediate structures for a DELTT structure fabricated using the above EBASE procedure. FIG. 3A shows sacrificial substrate 300 with an epitaxial stop etch layer 301 grown on its top surface. The stop etch layer 301 is composed of an epitaxial layer which is attacked more slowly by some etchants than is the sacrificial substrate 300. For a DELTT formed in the gallium arsenide/aluminum gallium arsenide material system, the stop etch layer is typically a few hundred nm thick layer of aluminum gallium arsenide of high aluminum content. The DELTT structure is then epitaxially grown on the stop etch layer 301. (Note that epitaxial growth is not required for all classes of devices and subcircuits which are amenable to use of EBASE methods.)

At the stage exhibited in FIG. 3a, just prior to bonding to the host substrate, the DELTT structure comprises an insulating buffer layer 302, collector 303, voltage drop layer 304, first tunneling barrier 305, resonant tunneling layer 308, second tunneling barrier 306, emitter layer 309, and insulating layer 309. [You've got the same numbers for the emitter and last insulating layer . . . ] Collector contact 311 and emitter contact 310 are formed, and topgate 313 and control gate 312 are placed on the top surface. The contacts are formed during this step in order to avoid annealing the structure after application of the adhesive layer, which may suffer deleterious effects from annealing. With an adhesive sufficiently resistant to high temperatures, contact formation could alternatively be done after application of the adhesive layer.

Figure 3B:
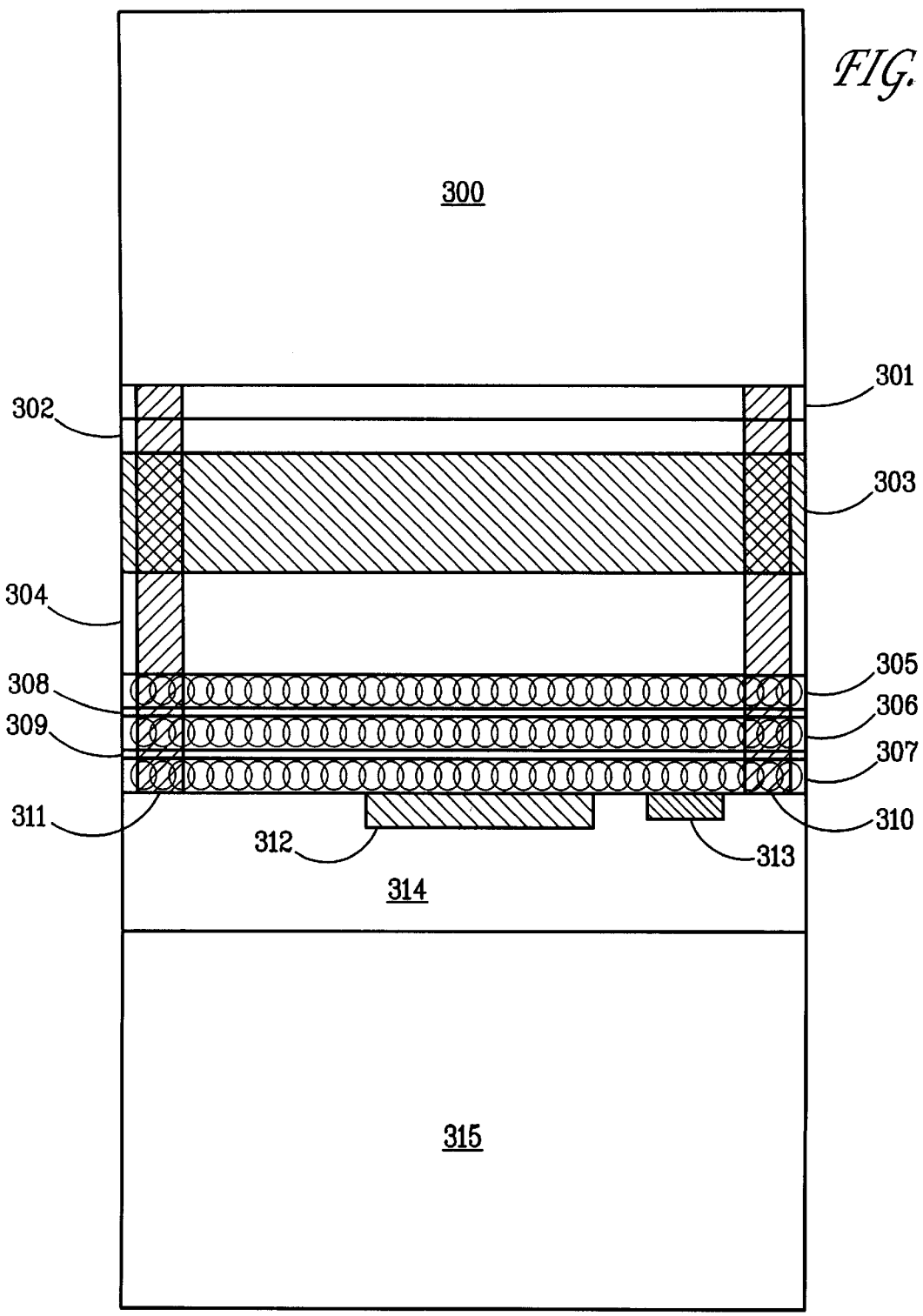
FIG. 3b shows the structure of 3a inverted and bonded to a host substrate.

FIG. 3b shows the structure flipped over and bonded front-side-down to host substrate 315 using an adhesive layer 314. Between FIGS. 3b and 3c, the sacrificial substrate 300 is etched off to reveal stop etch layer 301, yielding a smooth surface in close proximity to the collector layer on which depletion gates may easily be placed.

Figure 3C:
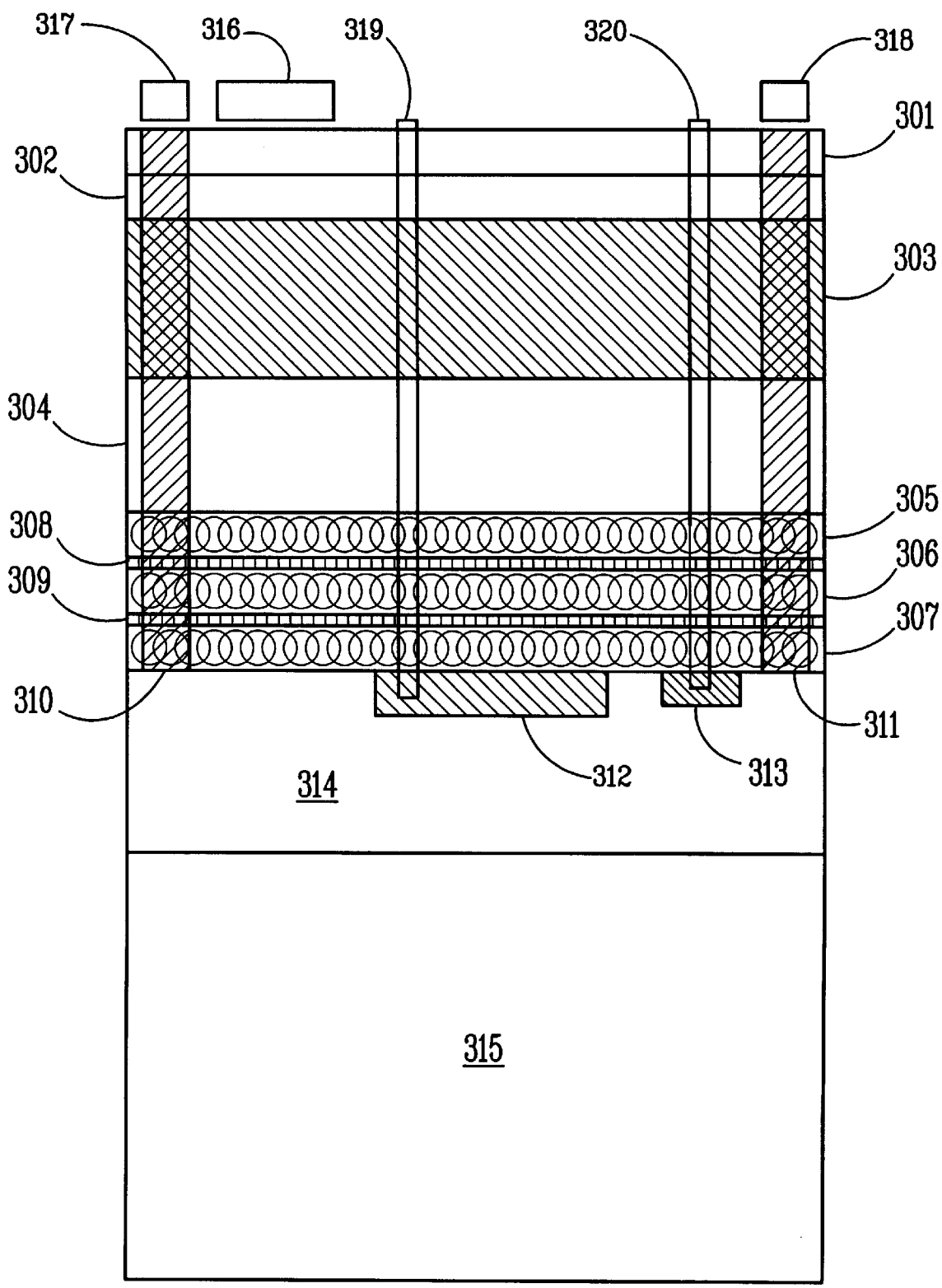
FIG. 3c shows the structure remaining after the sacrificial substrate has been removed and the final DELTT structure formed.

FIG. 3c shows the final DELTT structure after addition of vias (which can be metal plated holes, most simply) 319 and 320 to control gate 312 and depletion topgate 313, respectively. Contact pads 317 and 318 allow electrical contact to be made to emitter contact 310 and to collector contact 311, respectively. Also added is back depletion gate 316. The via holes are placed at locations sufficiently far away from the electrical conduction paths through the emitter layer 309 and collector layer 303 that they do not interfere with the operation of the device. The biases are set so that depletion backgate 316 generates a depletion region which insulates collector 303 and resonant tunneling layer 308 from emitter contact 310, and so the depletion topgate 313 generates a depletion region which insulates emitter layer 309 and resonant tunneling layer 308 from collector contact 311.

An alternate form of the stop-etch layer is shown in FIG. 4. Here the stop-etch layer on a GaAs sacrificial substrate 400 comprises two layers, a first layer 401 preferably consisting of high (about 70% Al to 30% Ga) aluminum content AlGaAs deposited on the substrate and a second layer 402 consisting of GaAs deposited on top of the first layer. First layer 401 typically has a thickness on the order of a few hundred nanometers, and second layer 402 has a thickness of 10–20 nm. The idea is to provide a first layer 401 having sufficient thickness that sacrificial substrate 400 can safely be etched away using, e.g., a citric acid etch buffered with $H_2O_2$ in the ratio 6.5:1, leaving the surface of first layer 401 exposed. Once the surface of the first layer 401 is exposed, it is etched away using an HF acid etch. HF does not rapidly attack GaAs, so the extremely thin GaAs second layer 402 remains between the etchant and any device layers. This allows the total thickness of the device layers to be as small as possible, thereby improving electrical performance. Such multi-step stop-etch layers can be designed for most semiconductor material systems, and can include any number of layers.

A wide range of semiconductor and quantum device structures, as well as general electronic and optoelectronic subcircuits, are compatible with the EBASE fabrication techniques. It should be understood that the detailed description of the invention, and the specific examples presented, while indicating embodiments of the present invention, are specified for illustration purposes only, while the scope of the present invention is intended to be limited only by the claims appended.

What is claimed is:

1. An epoxy bond and stop etch (EBASE) method of fabricating a circuit comprising a microelectronic device, comprising the steps of:
   a) forming a stop etch layer on a surface of a first semiconductor substrate;
   b) forming at least a portion of the microelectronic device on the stop etch layer, thereby forming a circuit layer on top of the stop etch layer;
   c) attaching the circuit layer to a surface of a host substrate using a bonding agent; and,
   d) removing the first substrate by physiochemical reaction, thereby forming an EBASE wafer.

2. The EBASE method of claim 1, wherein the circuit is contained within the EBASE wafer.

3. The EBASE method of claim 1, further comprising completing fabrication of the circuit.

4. The EBASE method of claim 3, wherein completing fabrication of the circuit comprises making effective contact between electronic circuitry resident on the circuit layer and electronic circuitry resident on the host substrate.

5. The EBASE method of claim 4, wherein making effective contact comprises use of a conductive bonding agent.

6. The EBASE method of claim 4, wherein making effective contact comprises inductive coupling.

7. The EBASE method of claim 4, wherein making effective contact comprises capacitive coupling.

8. The EBASE method of claim 4, wherein making effective contact comprises electromagnetic radiation.

9. The EBASE method of claim 1, wherein the bonding agent is an adhesive.

10. The EBASE method of claim 9, wherein the adhesive is metal-loaded to increase the thermal conductivity thereof.

11. The EBASE method of claim 9, wherein the adhesive, after curing, is an electrical conductor.

12. The EBASE method of claim 9, wherein the adhesive comprises epoxy.

13. The EBASE method of claim 1, further comprising forming a protective layer over the circuit layer prior to bonding the circuit layer to the host substrate.

14. The EBASE method of claim 13, wherein the protective layer and the stop etch layer have substantially identical chemical compositions.

15. The EBASE method of claim 1, wherein the stop etch layer also functions as part of the microelectronic device.

16. The EBASE method of claim 1, wherein removing the first substrate is carried out by steps comprising application of a chemical etchant.

17. The EBASE method of claim 1, wherein removing the first substrate is carried out by steps comprising mechanical abrasion.

18. The EBASE method of claim 1, wherein removing the first substrate is carried out by steps comprising sputtering.

19. The EBASE method of claim 1, wherein removing the first substrate is carried out by steps including plasma etching.

20. The EBASE method of claim 1, wherein the stop etch layer is in epitaxial relation to the first substrate.

21. The EBASE method of claim 20, wherein the device layers are in epitaxial relation to the first substrate.

22. The EBASE method of claim 1, wherein the stop etch layer comprises a plurality of chemically distinct layers.

23. The EBASE method of claim 22, further comprising the step of removing at least one of the chemically distinct layers comprising the stop etch layer.

24. The EBASE method of claim 22, further comprising the step of removing all but one of the chemically distinct layers comprising the stop etch layer.

25. The EBASE method of claim 22, wherein the chemically distinct layer furthest from the first substrate is also a device layer.

26. The EBASE method of claim 1, wherein the host substrate comprises a heat sink.

27. The EBASE method of claim 26, wherein the bonding agent has high thermal conductivity.

28. The EBASE method of claim 1, wherein the first substrate substantially consists of GaAs.

29. The EBASE method of claim 1, wherein the stop etch layer substantially consists of AlGaAs.

30. The EBASE method of claim 29, wherein the aluminum/gallium ratio of the stop etch layer is 30/70 or larger.

31. The EBASE method of claim 1, wherein removing the first substrate comprises the step of using a citric acid/hydrogen peroxide etchant.

32. The EBASE method of claim 22, wherein the first substrate substantially consists of GaAs, and the stop etch layer comprises a first layer of AlGaAs with a high aluminum content deposited on the first substrate and a second layer of GaAs deposited on the first layer.

33. The EBASE method of claim 32, wherein the first layer has a thickness between 100 and 1000 nanometers.

34. The EBASE method of claim 32, wherein the second layer has a thickness between 10 and 100 nanometers.

35. The EBASE method of claim 32, further comprising removing the first layer using a HF acid etch.

* * * * *